United States Patent [19]

Ohya

[11] Patent Number: 5,266,862
[45] Date of Patent: Nov. 30, 1993

[54] PIEZOELECTRIC ACTUATOR
[75] Inventor: Kazumasa Ohya, Tokyo, Japan
[73] Assignee: NEC Corporation, Tokyo, Japan
[21] Appl. No.: 780,779
[22] Filed: Oct. 23, 1991
[30] Foreign Application Priority Data Oct. 23, 1990 [JP] Japan .................................. 2-284843

[51] Int. Cl.⁵ .............................................. H01L 41/08
[52] U.S. Cl. ...................................... 310/328; 310/366
[58] Field of Search ........................... 310/366, 328

[56] References Cited

U.S. PATENT DOCUMENTS

| | | | |
|---|---|---|---|
| 4,384,230 | 5/1983 | Wisner | 310/328 |
| 4,564,782 | 1/1986 | Ogawa | 310/359 |
| 4,633,120 | 12/1986 | Sato et al. | 310/328 |
| 4,759,107 | 7/1988 | Ogawa et al. | 310/328 |
| 5,073,740 | 12/1991 | Jomura et al. | 310/328 |
| 5,089,739 | 2/1992 | Takahashi et al. | 310/328 |

OTHER PUBLICATIONS

Japanese Journal of Applied Physics, vol. 24,(1985), Supplement 24-3, pp. 209-212.

Primary Examiner—Mark O. Budd
Assistant Examiner—Thomas M. Dougherty
Attorney, Agent, or Firm—Burns, Doane, Swecker & Mathis

[57] ABSTRACT

In order to make uniform and smooth elongation of a piezoelectric actuator at the end faces thereof, at least one piezoelectric active layer with at least one non-conductive area formed at the central portion thereof is arranged between an inactive layer and an extreme piezoelectric active layer of the element.

5 Claims, 6 Drawing Sheets

FIG. 4
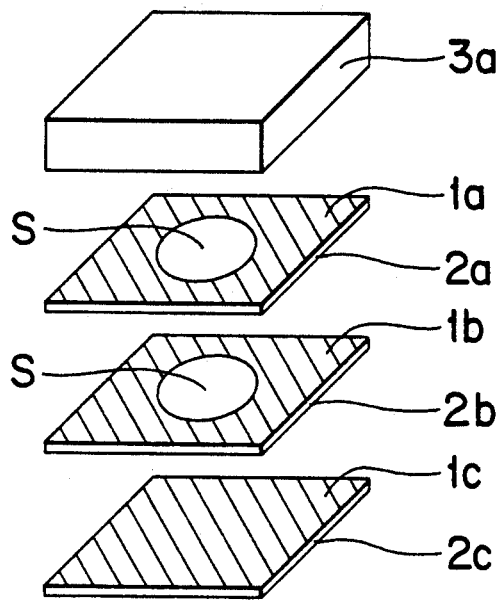
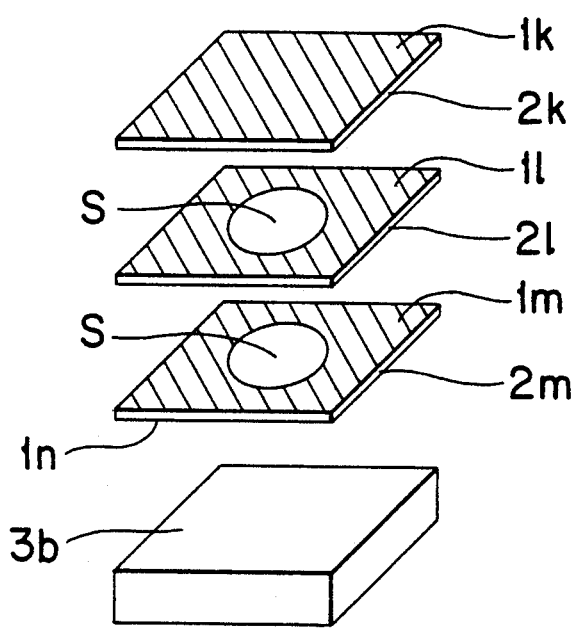

PIEZOELECTRIC ACTUATOR

BACKGROUND OF THE INVENTION

1. Field of the Invention

The present invention relates to a piezoelectric actuator utilizing an electrostrictive lengthwise effect which is suitable for use in piezoelectric actuators.

2. Description of the Prior Art

A piezoelectric actuator is designed to obtain a minute mechanical displacement utilizing a piezoelectric actuator (hereinafter referred to as "actuator") which can convert electric energy into mechanical energy and is used in the field of applications which require precise control of movement of a minute position, such as a mass flow controller used in manufacturing apparatus of semiconductor IC circuits, an X-Y table used in exposure systems for the manufacture of the IC circuits, plastics injection molding machines and so on.

One of such a type of conventional piezoelectric actuators is described in Japanese Journal of Applied Physics, Vol. 24 (1985), Supplement 24-3, pp. 209-212.

As shown in FIG. 1, the prior art piezoelectric actuator comprises a laminated sintered member including a plurality of piezoelectric active layers (hereinafter referred to as "active layer") 2a, 2b, 2c, 2d ... 2k, 2l and 2m, each layer being made of an electrostrictive ceramic material, a plurality of internal electrodes 1a, 1b, 1c ... 1m and 1n made of silver, palladium alloy or platinum, each of which is placed between each pair of piezoelectric active layers, and inactive layers 3a and 3b each in the form of thicker electrostrictive ceramic sheet, these inactive layers 3a and 3b being located to cover the opposite ends of the laminated sintered member. The laminated sintered member also comprises insulating layers 4a, 4b, 4c ... 4m and 4n of glass or the like disposed to insulate the internal electrodes 1a, 1b ... 1n on alternate layers; a pair of external electrodes 5a and 5b disposed at opposite sides of the laminated sintered member and disposed to perform electric connection on alternate internal electrodes; and a pair of leads 6a and 6b electrically connected with the external electrodes 5a and 5b, respectively.

In such an arrangement, the piezoelectric active layer assembly 2 is expanded in its longitudinal direction and contracted in a direction perpendicular to said longitudinal direction when an electric field is applied to the piezoelectric actuator. On the other hand, the inactive layers 3a and 3b are not subject to any piezoelectric effect. As a result, the piezoelectric active layer assembly 2 is brought into intense engagement with the inactive layers 3a and 3b. Since the piezoelectric active layer assembly 2 is incorporated integrally between the inactive layers 3a and 3b, the piezoelectric actuator is deformed without slippage at the interface between each pair of adjacent layers. As a result, the opposite end faces of the piezoelectric actuator will be bulged outwardly, as shown in FIG. 2.

This will create uneven strain in the piezoelectric actuator.

The uneven strain may be overcome if the opposite end faces of the piezoelectric actuator are adhered to any smooth fixed surfaces. However, this may cause internal stress in the piezoelectric actuator and, in the worst case, may break the element.

SUMMARY OF THE INVENTION

It is therefore an object of the present invention to overcome the disadvantages of the prior art and to provide a piezoelectric actuator in which elongation of the actuator at the end faces thereof is made uniform and smooth and which can prevent any damage due to any internal stress partially created therein.

To this end, the present invention provides a piezoelectric actuator comprising first piezoelectric active layers including electrostrictive ceramic members and internal electrodes which are alternately laminated one on another and inactive layers creating no piezoelectric effect and being located on the first piezoelectric active layer on the opposite ends thereof in the direction of lamination, said actuator being characterized by at least one second piezoelectric active layer disposed between each of the inactive layers and the first piezoelectric active layer, the second piezoelectric active layer also serving as an internal electrode which has a non-conductive area thereon.

BRIEF DESCRIPTION OF THE DRAWINGS

FIG. 4 is an exploded perspective view illustrating one type of internal electrodes used in the piezoelectric actuator shown in FIG. 3.

DETAILED DESCRIPTION OF THE PREFERRED EMBODIMENTS

The present invention will now be described with reference to the drawings.

Figure 1:
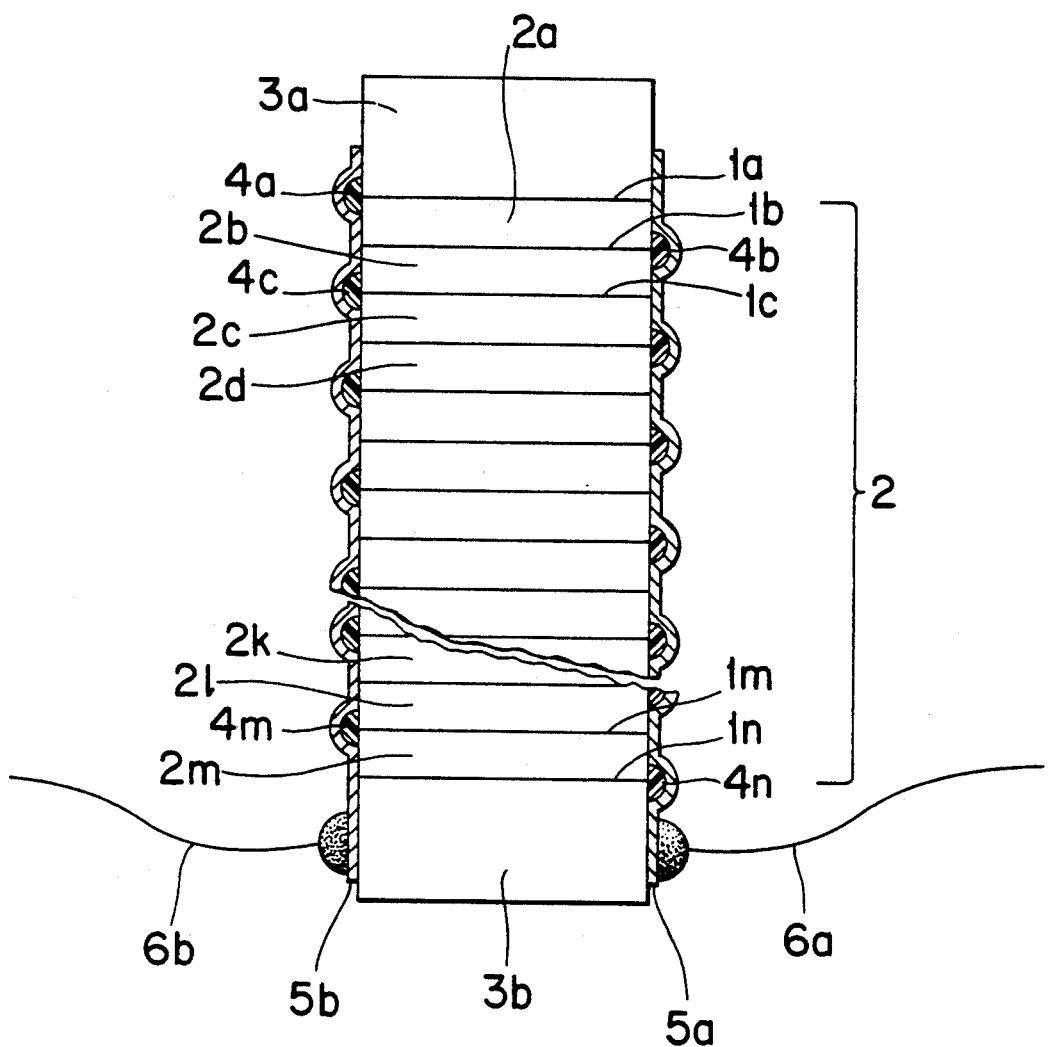
FIG. 1 is a longitudinal cross-section of a piezoelectric actuator constructed in accordance with the prior art.
Figure 2:
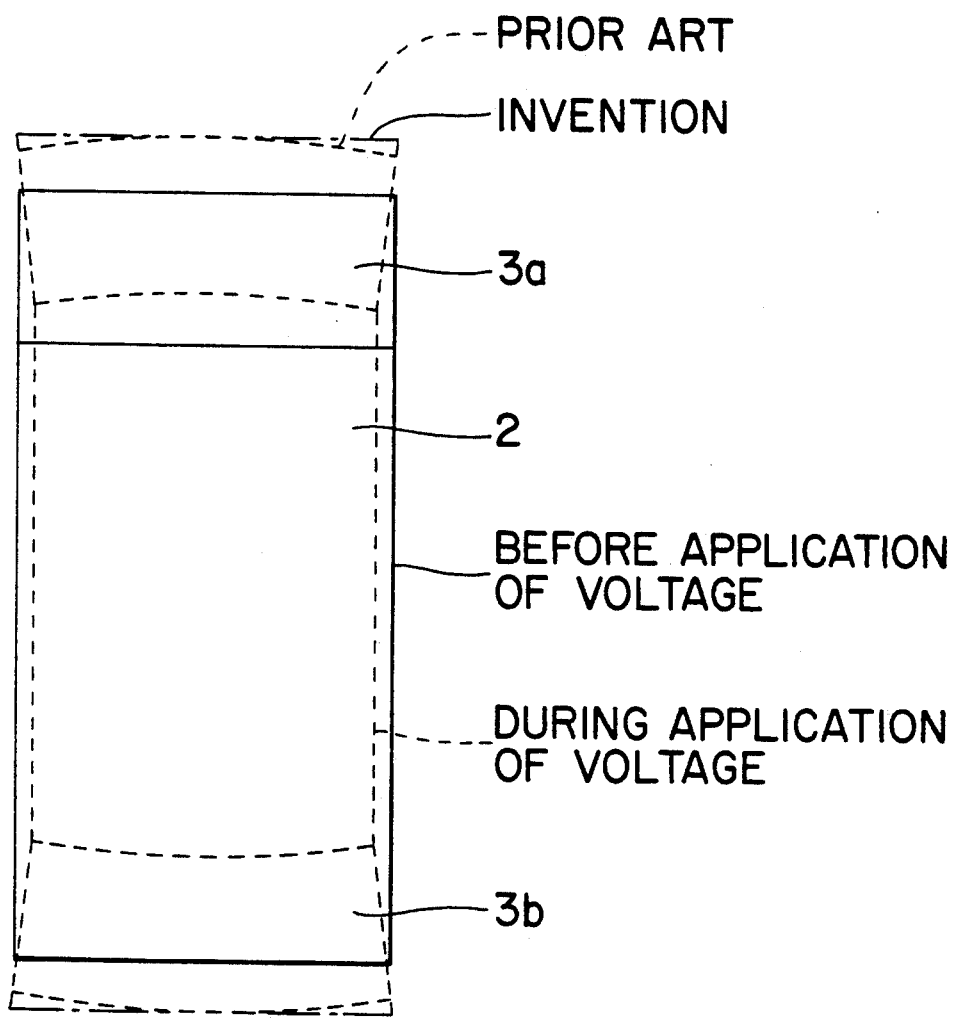
FIG. 2 is a view illustrating deformation of a piezoelectric actuator due to the pizoelectric effect according to the prior art and the present invention.
Figure 3:
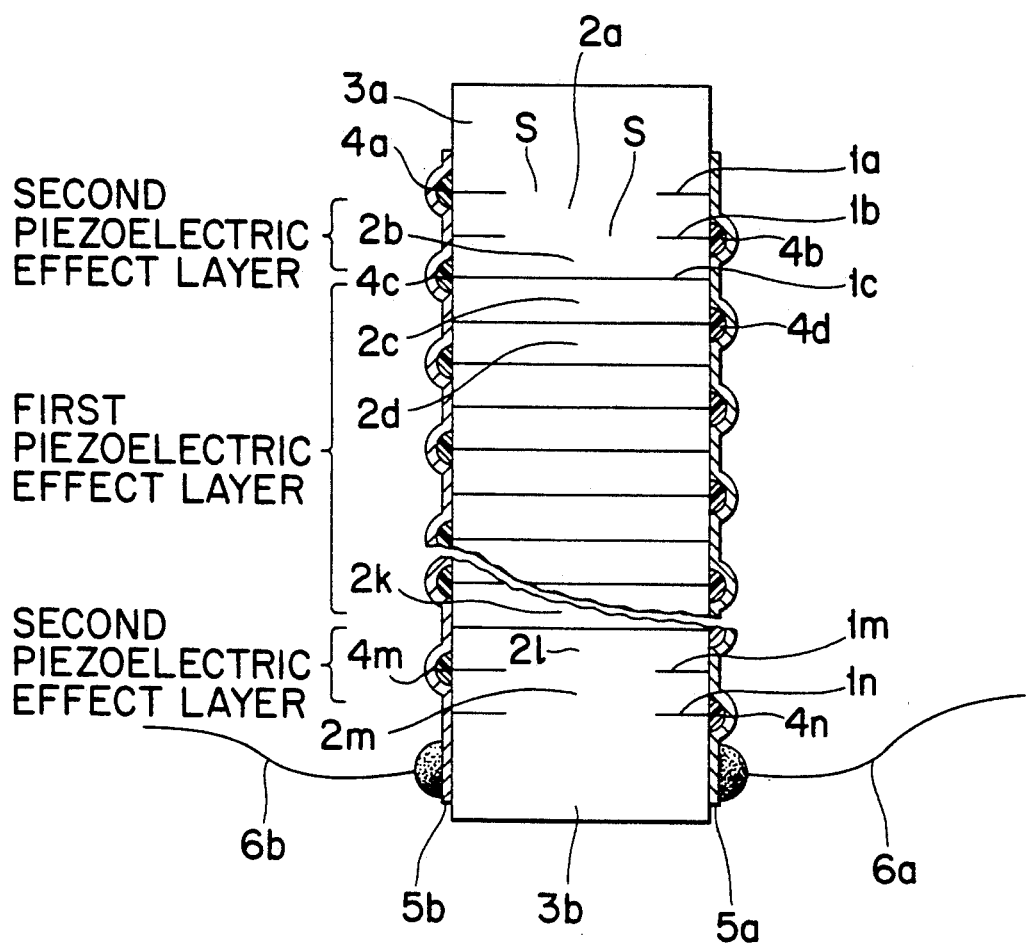
FIG. 3 is a longitudinal cross-section of one embodiment of a piezoelectric actuator fabricated in accordance with the present invention.

FIG. 3 is a longitudinal cross-section of one embodiment of a piezoelectric actuator fabricated in accordance with the present invention while FIG. 4 is an exploded perspective view illustrating one type of internal electrodes used in the piezoelectric actuator shown in FIG. 3. In FIG. 3, parts similar to those of FIG. 1 are designated by similar reference numerals.

First of all, an organic solvent binder and plasticizing material are added to and mixed with a calcinated powder of electrostrictive material such as titanic acid, lead zirconate, nickel lead niobate or the like. The resulting slurry is formed into a green sheet having a thickness of about 130 μm by the use of a doctor blade process. As shown in FIG. 4, a conductive paste containing powdered silver-palladium alloy or platinum is screen printed on a laminated sintered member while leaving non-conductive areas S on piezoelectric active layers 2a and 2b adjacent to the top of the laminated sintered member and piezoelectric active layers 2m and 2l (which layers will be referred to "second piezoelectric active layers") adjacent to the bottom of the laminated sintered member at their central portions. The conductive paste is screen printed on the other piezoelectric active layers $2c$, $2d \ldots 2k$ (which will be referred to as "first piezoelectric active layers") over the entire surface areas thereof. In this embodiment, the cross-section of the piezoelectric actuator is of a square configuration of 10 mm × 10 mm while each of the non-conductive areas S is in the form of a circle having a diameter of 8 mm.

The inactive layers $3a$ and $3b$ may be formed of the same material as that of the piezoelectric active layers $2a$ to $2m$. After the piezoelectric active layers $2a$ to $2m$ and the inactive layers $3a$ and $3b$ have been laminated, the resulting lamination is pressed under heat and pressure to form an integral member. After buring out the binder, the integral member is fired for three hours at 1000° C. to provide a laminated sintered member as shown in FIG. 3.

The conductive paste layers sandwiched between each pair of adjacent piezoelectric active layers will form internal electrodes $1a$, $1b$, $1c \ldots 1m$ and $1n$.

The outer edges of the internal electrodes $1a$, $1b \ldots 1n$ expose outwardly at the opposite sides of the laminated sintered member thus formed. These outer exposed edges of the internal electrodes are alternately covered with insulating layers $4a$, $4b$, $4c$, $4d \ldots 4m$ and $4n$ each of which is formed by depositing and baking powdered glass on the corresponding edge using the electrical migration. Subsequently, a pair of external electrodes $5a$ and $5b$ are formed by applying and baking a conductive paste containing powdered silver and glass on the opposite sides of the laminated sintered member so that the internal electrodes $1a$, $1b$, $\ldots 1n$ will be electrically connected together on alternate layers. The product is completed when a pair of leads $6a$ and $6b$ are electrically connected with the external electrodes $5a$ and $5b$, respectively.

Figure 5:
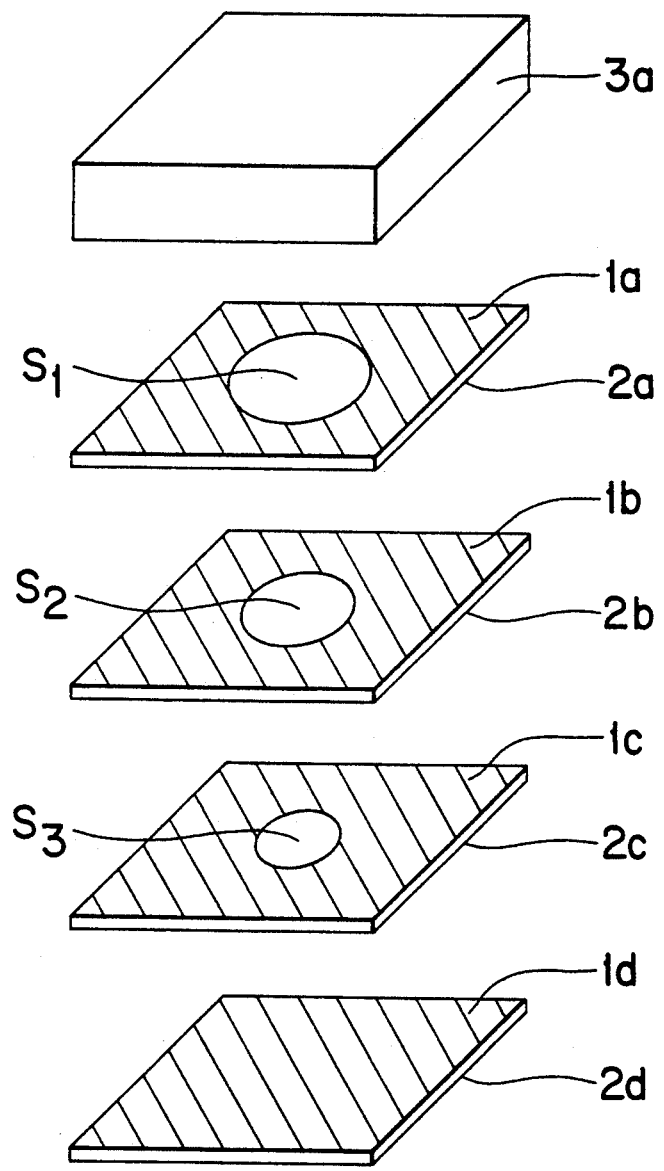
FIG. 5 is a view similar to FIG. 4, illustrating another type of internal electrode usable in the piezoelectic actuator of the present invention.

FIG. 5 shows the other types of internal electrode usable in the piezoelectric actuator of the present invention. In this drawing, only the internal electrodes of the piezoelectric actuator adjacent one (top) end thereof are shown for simplicity. The cross-section of this piezoelectric actuator is of a square shape of 15 mm × 15 mm. The internal electrodes $1a$, $1b$ and $1c$ have non-conductive areas $S_1$, $S_2$, and $S_3$ having diameters of 13 mm, 10 mm and 8 mm, respectively. The material and its thickness are the same as those of the previous embodiment shown in FIG. 4.

The embodiment shown in FIG. 5 can be applied to piezoelectric actuators of larger sizes since the central non-conductive areas $S_1$ to $S_3$ on the internal electrodes are different from one another. At the same time, the profile of strain at the opposite ends of the piezoelectric actuator can be be diminished.

Figure 6A:
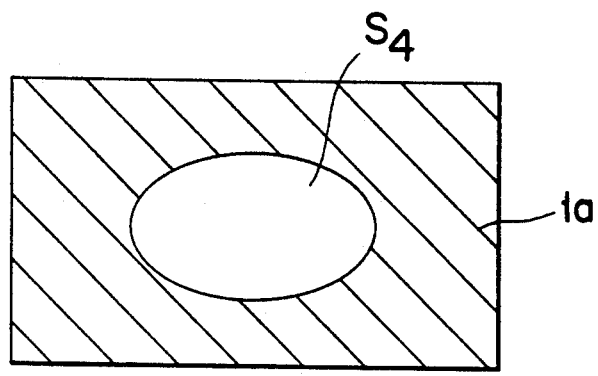
FIGS. 6A, 6B, 6C and 6D show various other types of internal electrodes usable in the piezoelectric actuator of the present invention.
Figure 6B:
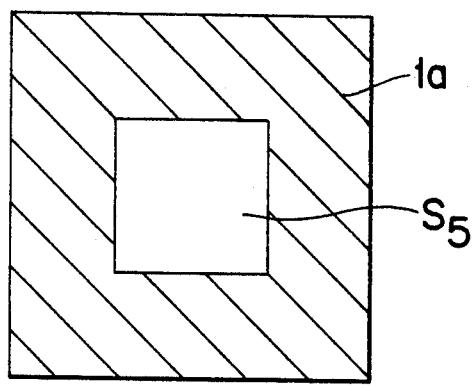
Figure 6C:
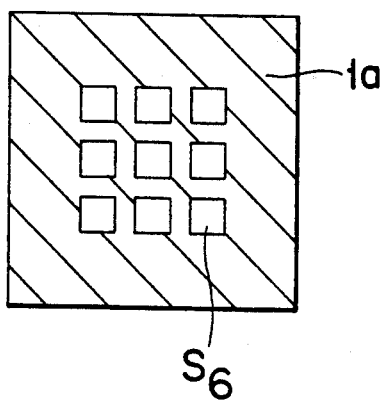
Figure 6D:
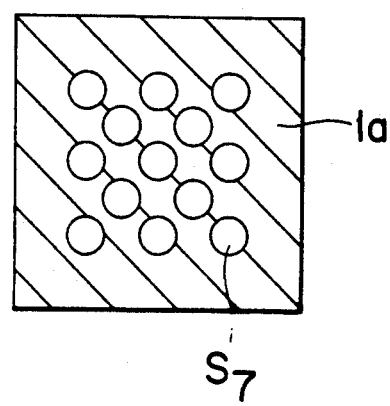

Although two different kinds of internal electrodes have been described as to a single circular non-conductive area on a single internal electrode, a single elliptic area $S_4$ or a polygonal non-conductive area $S_5$ may be provided on an internal electrode as shown in FIG. 6A or 6B or a plurality of areas $S_7$ or polygonal non-conductive areas $S_6$ may be provided on the same internal electrode as shown in FIG. 6C or 6D.

From the foregoing, it will be apparent that the piezoelectric actuator of the present invention has a reduced elongation at the central portion in comparison with that of the peripheral portion by adding the second piezoelectric active layers onto the opposite ends of the first piezoelectric active layers, the second piezoelectric active layers having internal electrodes formed with the central non-conductive areas. If such central non-conductive areas are not provided therein, the outer ends of the inactive layers could be bulged outwardly to increase elongation at the central portion. Thus, the second piezoelectric active layers make the elongation at the opposite ends of the element uniform and smooth. In addition, any breaking-down of the element can be prevented by the second piezoelectric active layers.

What is claimed is:

1. A piezoelectric actuator comprising:
   first piezoelectric active layers including an alternate lamination of electrostrictive ceramic materials and internal electrodes;
   a pair of inactive layers respectively disposed at the opposite ends of said piezoelectric actuator in the direction of lamination; and
   at least one second piezoelectric active layer sandwiched between an end of each inactive layer of said pair of inactive layers and an end of said first piezoelectric active layers, each said second piezoelectric active layer including a non-conductive area formed thereon at the central portion.

2. A piezoelectric actuator according to claim 1, wherein the non-conductive area of said at least one second piezoelectric active layer is of a circular, elliptic or polygonal configuration.

3. A piezoelectric actuator according to claim 1, wherein each said second piezoelectric active layer has a non-conductive area of the same configuration.

4. A piezoelectric actuator according to claim 1, wherein the non-conductive area of each said second piezoelectric active layer has a smaller size as the second piezoelectric active layer is located further from an inactive layer.

5. A piezoelectric actuator according to claim 1, wherein said at least one second piezoelectric active layer includes a plurality of non-conductive areas.

* * * * *